(12) United States Patent
Velez et al.

(10) Patent No.: US 6,930,886 B2
(45) Date of Patent: Aug. 16, 2005

(54) ELECTRONIC COMPONENT SECUREMENT SYSTEM

(75) Inventors: Richard G. Velez, Sacramento, CA (US); Gregory S. Meyer, Roseville, CA (US)

(73) Assignee: Hewlett-Packard Development, L.P., Houston, TX (US)

( * ) Notice: Subject to any disclaimer, the term of this patent is extended or adjusted under 35 U.S.C. 154(b) by 171 days.

(21) Appl. No.: 10/426,582

(22) Filed: Apr. 30, 2003

(65) Prior Publication Data

US 2004/0218368 A1 Nov. 4, 2004

(51) Int. Cl.[7] ............................................. G06F 1/16
(52) U.S. Cl. .................... 361/727; 361/724; 361/756; 312/334.11; 211/187
(58) Field of Search ...................... 361/679, 717–719, 361/724–727, 730–732, 752, 756; 312/223.1, 333.3, 334.4, 334.5, 265.4, 333, 334.11, 334.18; 211/26, 187, 186, 189, 190, 191; 411/352, 353, 107, 999, 340, 342, 344, 345, 508, 509, 551, 913

(56) References Cited

U.S. PATENT DOCUMENTS

| | | | |
|---|---|---|---|
| 4,707,764 A | 11/1987 | Cogan | |
| 4,901,202 A | 2/1990 | Leschinger | |
| 5,209,356 A | 5/1993 | Chaffee | |
| 5,312,005 A | * 5/1994 | Odell | ............................ 211/189 |
| 5,668,696 A | 9/1997 | Schmitt | |
| 5,791,498 A | * 8/1998 | Mills | ............................ 211/26 |
| 5,896,273 A | 4/1999 | Varghese et al. | |
| 5,941,621 A | * 8/1999 | Boulay et al. | ............ 312/334.4 |
| 6,021,909 A | 2/2000 | Tang et al. | |
| 6,067,233 A | 5/2000 | English et al. | |
| 6,175,502 B1 | 1/2001 | Schaerer et al. | |
| 6,181,549 B1 | 1/2001 | Mills et al. | |
| 6,185,098 B1 | 2/2001 | Benavides | |
| 6,230,903 B1 | 5/2001 | Abbott | |
| 6,255,583 B1 | 7/2001 | Johnson et al. | |
| 6,297,962 B1 | 10/2001 | Johnson et al. | |
| 6,305,556 B1 | 10/2001 | Mayer | |
| 6,424,534 B1 | 7/2002 | Mayer et al. | |
| 6,452,805 B1 | 9/2002 | Franz et al. | |
| 6,469,899 B2 | 10/2002 | Hastings et al. | |
| 6,496,366 B1 | 12/2002 | Coglitore et al. | |
| 6,513,770 B1 | 2/2003 | Franz et al. | |
| 6,578,939 B1 | * 6/2003 | Mayer | ........................ 312/334.5 |
| 6,622,873 B2 | * 9/2003 | Hegrenes et al. | .............. 211/26 |
| 6,682,282 B2 | * 1/2004 | Allen | ........................... 411/353 |
| 6,709,212 B1 | * 3/2004 | Lauchner | ..................... 411/342 |
| 6,746,193 B1 | * 6/2004 | Drake | ........................... 411/175 |

* cited by examiner

Primary Examiner—Michael Datskovskiy

(57) ABSTRACT

An electronic component support system includes a vertical support unit having an opening, an electronic component having a chassis positioned within the opening and a securement system. The securement system includes a coupler configured to be releasably coupled to and supported by the vertical support unit prior to being coupled to the chassis and without projecting into the opening, wherein the coupler is coupled to the chassis to secure the chassis against movement in at least one direction relative to the vertical support unit.

51 Claims, 6 Drawing Sheets

FIG. 6
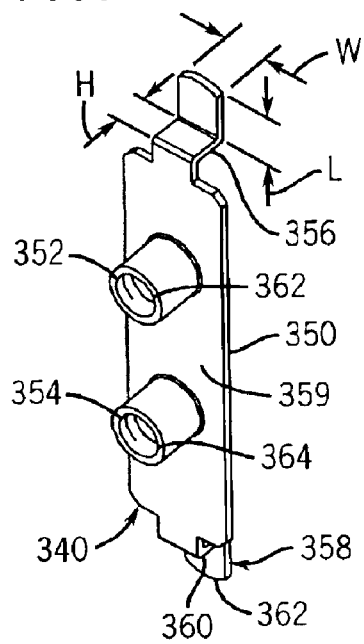
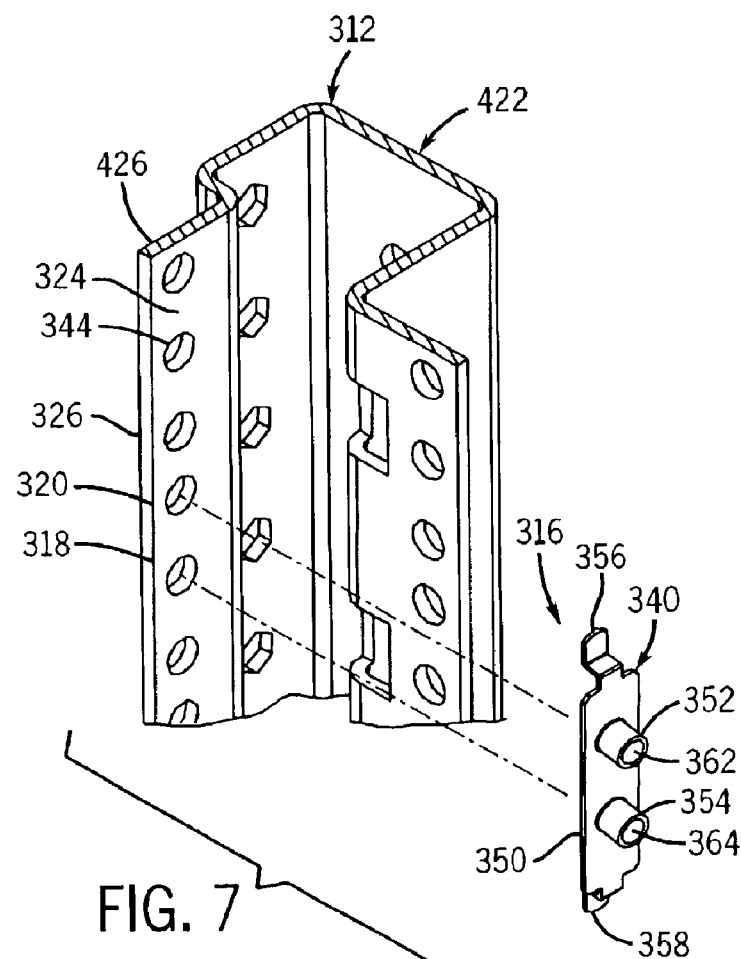
FIG. 7

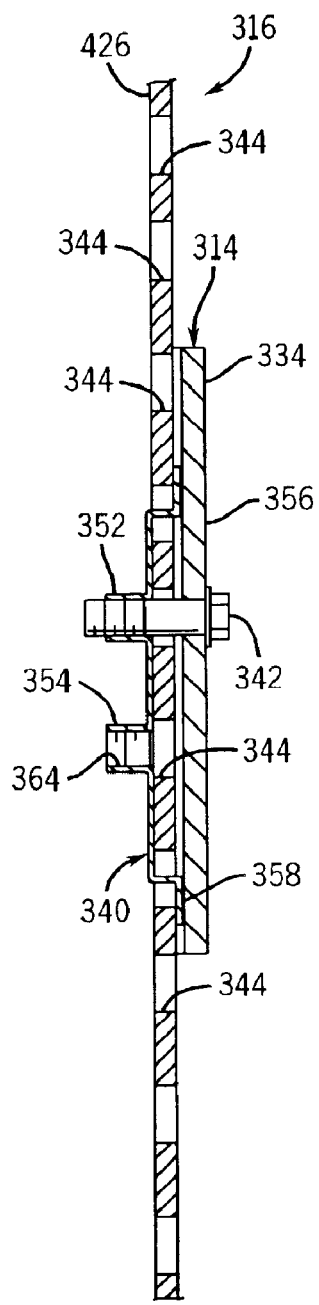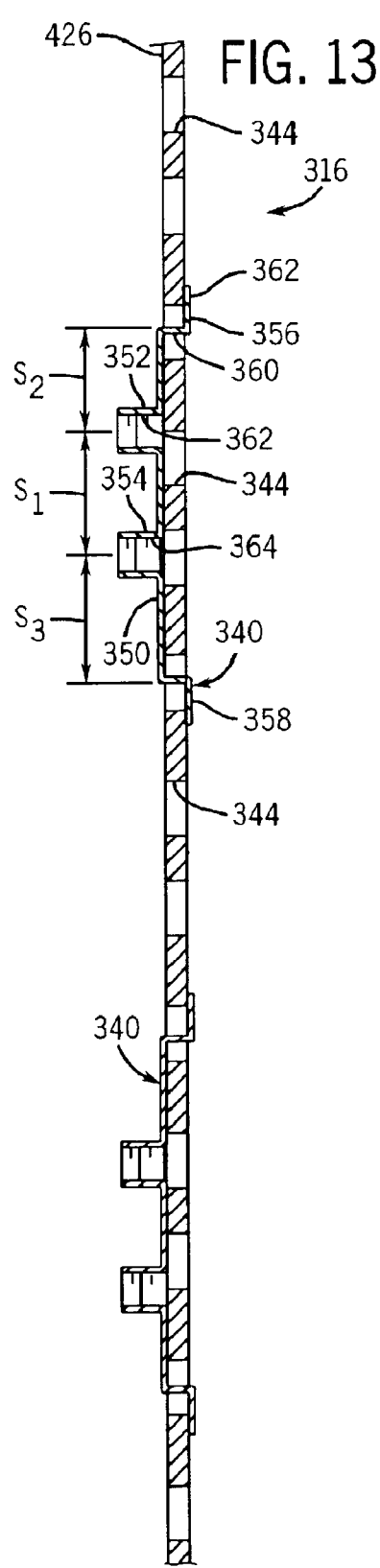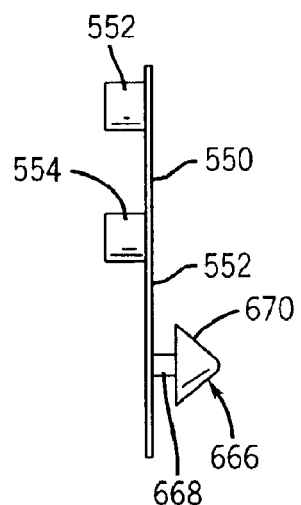
FIG. 12
FIG. 13
FIG. 14
FIG. 15

ELECTRONIC COMPONENT SECUREMENT SYSTEM

BACKGROUND

Computing and data storage systems, such as those used in communication systems, typically include a plurality of hardware elements or computing components such as servers, routers, switches and the like. Due to space limitations, such components are usually vertically stacked or supported in a vertical support unit such as a cabinet, shelving system, closet, enclosure or rack. Each component typically includes a chassis that at least partially encloses and supports the component's internal electronics. The component chassis is inserted through and into an opening defined by the vertical support unit.

In one known system, the component chassis is supported in a rack that includes four vertically oriented support columns. The support columns include either support panels or shelves that are attachable to the chassis to support the chassis in a horizontal orientation within the opening between the columns. In one known system, the chassis is stationarily mounted to the rack. In another known system, the chassis is mounted to the rack by slides, permitting the component to be slid at least partially out of a rack.

In many instances, such as during shipping of such components, it is desirable to secure such components to the vertical support unit to stabilize and prevent damage to the components. Under one known securement method, a bolt is inserted through a flange of the component chassis and is threaded into a tapped or threaded aperture formed in a column of the rack. To accommodate different vertical positions of the components within the rack, the column includes a multitude of vertically spaced tapped apertures.

FIGS. 1 and 2 illustrate another known securement method in which a U-shaped clip 20 (known as a "Tinnerman clip") wraps about a post or column 22 of a rack. The clip 20 includes a tubular internally threaded portion 24 which is positioned on a rear side of the column 22. The tubular portion 24 is aligned with one of the plurality of apertures 26 formed in column 22 of the rack. Once the clip is positioned about the column and tubular portion 24 is aligned with one of apertures 26, the component chassis (not shown) is moved into the opening of the rack such that the flange of the chassis overlaps the front side of column 22. The flange typically includes an aperture which must be aligned with aperture 26 and the tubular portion 24. Thereafter, a bolt (not shown) is inserted through the chassis flange aperture, and through column aperture 26. The bolt is then threaded into tubular portion 24 of clip 20 to secure the component and its chassis to the rack.

SUMMARY OF THE INVENTION

According to one aspect of the present invention, an electronic component support system includes a vertical support unit having an opening, an electronic component having a chassis positioned within the opening and a securement system. The securement system includes a coupler configured to be releasably coupled to and supported by the vertical support unit prior to being coupled to the chassis and without projecting into the opening, wherein the coupler is coupled to the chassis to secure the chassis against movement in at least one direction relative to the vertical support unit.

According to another aspect of the present invention, an electronic component securement system for use with a vertical support unit and electronic component chassis positioned within an opening of the vertical support unit includes a coupler. The coupler is adapted to be releasably mounted to the vertical support unit so as to be supported by the vertical support unit prior to being coupled to the electronic component and without diminishing a size of the opening. The coupler is configured to be releasably coupled to the chassis to prevent movement of the chassis relative to the vertical support unit in at least one direction.

According to another aspect of the present invention, a coupler is provided for use as part of a securement system for securing an electronic component within an opening of a vertical support unit having an opening border surface facing the opening. The coupler includes a body configured to be releasably coupled to the vertical support unit and independently supported by the vertical support unit without extending across the opening border surface. The coupler assists in securing the chassis of the electronic component to the vertical support unit.

According to another aspect of the present invention, a method for securing an electronic component chassis to a vertical support unit while the chassis is within an opening of the vertical support unit is disclosed. The method includes releasably coupling a coupler to the vertical support unit such that the coupler is independently supported by the vertical support unit without intruding into the opening and securing the electronic component chassis to the coupler.

BRIEF DESCRIPTION OF THE DRAWINGS

FIG. 6 is a top perspective view of a coupler of the component securement system of FIG. 5.

FIG. 7 is a fragmentary perspective view of the vertical support unit of FIG. 5 and the coupler of FIG. 6 illustrating positioning of the coupler relative to the vertical support unit.

FIG. 12 is a sectional view of the component support system of FIG. 11 taken along lines 12—12.

FIG. 13 is a sectional view of the coupler of FIG. 6 mounted in various locations along the vertical support unit.

FIG. 14 is a side elevational view of a first alternative embodiment of the coupler of FIG. 6.

FIG. 15 is a side elevational view of a second alternative embodiment of the coupler of FIG. 6.

DETAILED DESCRIPTION OF THE PREFERRED EMBODIMENTS

Figure 3:
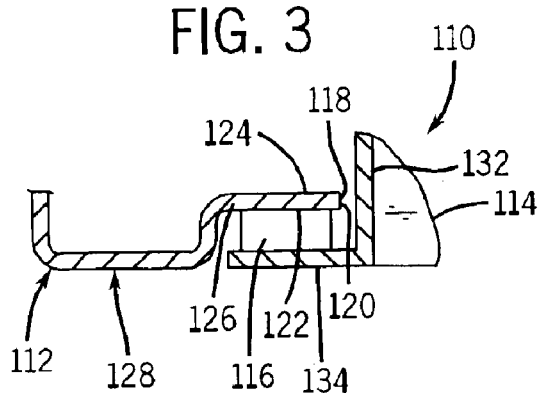
FIG. 3 is a top sectional view schematically illustrating an electronic component support system including an electronic component securement system securing an electronic component to a vertical support unit.

FIG. 3 schematically illustrates electronic component support system 110 which generally includes vertical support unit 112, electronic component 114 and electronic component securement system 116. Vertical support unit 112 generally comprises a structure configured to support one or more electronic components 114 in a vertically stacked orientation or arrangement. Vertical support unit 112 may comprise a cabinet, shelving system, closet, enclosure or rack which includes an opening 118 bounded or defined by an interior facing or component facing surface 120. Opening 118 is sized and located to receive electronic component 114.

Vertical support unit 112 additionally includes side surfaces 122, 124. Side surfaces 122 and 124 generally extend opposite one another and face in opposite directions that are generally parallel to a center line of opening 118. In one embodiment wherein vertical support unit 112 comprises a rack, surfaces 122 and 124 are provided by an inwardly projecting wall 126 of a post or column 128 of vertical support unit 112. In alternative embodiments, depending upon the configuration of component 114 as well as the configuration of securement system 116, vertical support unit 112 may comprise other types of vertical support units having other structures providing surfaces 120, 124 and 126 which extend along and define opening 118.

Electronic component 114 generally comprises a conventionally known or a future developed electrical component such as commonly employed in computing and data storage systems and in communication systems. Examples of component 114 include servers, routers, switches and the like. Component 114 includes a variety of internal electronics (processor, backplane or mother printed circuit boards, daughter cards, power supplies and the like) supported and at least partially enclosed by an enclosure or chassis 132. Chassis 132 generally includes an outwardly extending panel or flange 134 which facilitates securement of chassis 132 to vertical support unit 112. In the particular embodiment shown, flange 134 is configured to outwardly extend past opening 118 so as to at least partially overlap vertical support unit 112. Flange 134 comprises a separate rigid angled member fixedly coupled to the remainder of chassis 132. In alternative embodiments, flange 134 may be integrally formed as part of a single unitary body with the remainder of chassis 132.

Securement system 116 generally comprises one or more structures configured to secure chassis 132 to vertical support unit 112 without diminishing a size of opening 118. To facilitate easy securement, securement system 116 is also configured to be supported by vertical support unit 112 prior to being coupled to electronic component 114. As a result, the size of opening 118 is not reduced by system 116, enabling chassis 132 to be larger while avoiding scratches or other damage to chassis 132 during insertion or removal of component 114 through opening 118.

Figure 1:
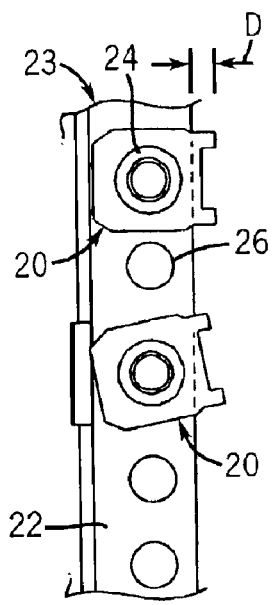
FIG. 1 is a fragmentary front elevational view of a prior art clip mounted to a rack.
Figure 2:
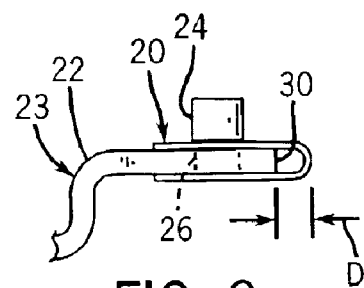
FIG. 2 is a fragmentary top plan view of the clip and rack of FIG. 1.

Referring to FIGS. 1 and 2, it has been discovered that because conventional clips 20 wrap around column 22 to facilitate their securement to column 22, clips 20 inherently extend across the opening facing surface 30 of rack 23. In particular, clips 20 project into the opening of rack 23 by a distance D. Because clips 20 are typically employed on both sides of the opening, the total encroachment is 2D. In addition, tightening of the bolt that extends through clip 20 often results in rotation of the clip 20, further reducing the size of the opening. This encroachment upon the opening of rack 23 necessitates a smaller component chassis. Alternatively, if the chassis is not reduced in size, insertion and removal of the chassis through the opening is difficult, resulting in the scratching of the chassis. As best shown by FIG. 3, securement system 116 secures chassis 132 to vertical support unit 112 without extending across surface 120 so as to not diminish the size of opening 118.

Securement system 116 is configured to be releasably coupled to vertical support unit 112 so as to enable securement system 116 to be selectively repositioned along the vertical height of support unit 112 and along opening 118 to accommodate various possible positions of component 114. As a result, securement system 116 is much less expensive as compared to the conventional practice of tapping hundreds of holes along the vertical height of vertical support unit 112. In addition, should securement system 116 become damaged during or after production, securement system 116 may easily be replaced without requiring repair or replacement of the entire vertical support unit 112.

In the embodiment schematically shown in FIG. 3, vertical support unit 116 comprises one or more structures which releasably mount to surface 122 of walls 126 and which also are releasably coupled to flange 134 of chassis 132. In one embodiment, one of wall 126 and system 116 includes a detent while the other of wall 126 and system 116 includes a detent engaging member. The detent and detent engaging member are configured to cooperate with one another to releasably couple system 116 to vertical support unit 112. In a similar fashion, one of flange 134 and system 116 includes a detent while the other of system 116 and flange 134 includes a detent engaging protuberance or projection which is configured to cooperate with the detent to releasably secure chassis 132 to system 116 to vertical support unit 112 against movement in at least one direction.

Securement system 116 is configured to move along wall 126 of vertical support unit 112 between a plurality of spaced vertical positions to facilitate the securement of component 114 to vertical support unit 112 at the plurality of vertically spaced positions. In one embodiment, system 116 is releasably or removably coupled to wall 126 such that system 116 may be selectively mounted to wall 126 at the plurality of vertically spaced positions. In another embodiment, securement system 116 is slidably supported in a vertical direction along wall 126 by a tongue and groove mechanism, wherein means are provided for releasably retaining system 116 relative to wall 126 at one of the plurality of vertical positions. Such means may comprise a plurality of vertically spaced detents provided on one of wall 126 and securement system 116 and a detent engaging protuberance provided on the other of wall 126 and securement system 116, wherein the detent engaging protuberance is resiliently biased towards and into engagement with the detents. Although securement system 116 is illustrated as being positioned generally between side surface 122 and flange 134, securement system 116 may alternatively pass at least partially through one or both of flange 134 and wall 126 when secured to either or both of wall 126 or flange 134.

Figure 4:
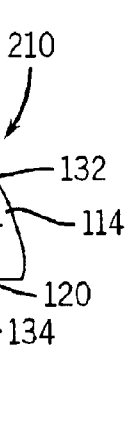
FIG. 4 is a sectional view of a first alternative embodiment of the electronic component support system of FIG. 3.

FIG. 4 schematically illustrates electronic component support system 210, an alternative embodiment of system 110. For ease of discussion, those components of system 110 which correspond to components of system 210 are numbered similarly. System 210 is similar to system 110 except that system 210 includes securement system 216 in lieu of securement system 116. Securement system 216, schematically shown, releasably secures or couples chassis 132 of component 114 to vertical support unit 112. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

System 216 generally includes vertical support unit coupler 240 and chassis coupler 242. Vertical support coupler 240 generally comprises a structure configured to be releasably coupled to wall 126 of vertical support unit 112. Wall 126 includes an aperture 244 adjacent to coupler 240. Coupler 240 is configured so as to extend across aperture 244 when releasably coupled to wall 126. In one embodiment, one of coupler 240 and wall 126 includes a detent while the other of coupler 240 and wall 126 includes a detent engaging protuberance which cooperatively engage one another to releasably retain coupler 240 along and against surface 124 of wall 126. For purposes of disclosure, the term "detent" means any opening, notch, orifice, slit, gap and the like, while detent engaging protuberance means any projection, such as a stud, bolt, hook, catch and the like, configured to engage the detent. In one embodiment, coupler 240 includes one or more flexible catches, hooks, prongs or the like which are at least partially received within detents along surface 124. In one embodiment, wall 126 includes a plurality of detents that comprise apertures extending completely through wall 126 adjacent aperture 244 which receive and removably retain the at least one detent engaging protuberance of coupler 240. As a result, coupler 240 may be secured to wall 126 of vertical support unit 112 independent of coupler 242 and prior to engagement with coupler 242.

Coupler 242 is coupled to flange 134 of chassis 132 and is configured to extend through aperture 244 into releasable engagement with coupler 240. In one embodiment, flange 134 includes an aperture 248 which is aligned with aperture 244 and through which coupler 242 extends. In one embodiment, coupler 242 comprises a fastener, such as a bolt, which passes through apertures 248 and 244 into threaded engagement with coupler 240. In alternative embodiments, coupler 242 may comprise other conventionally known or future developed fasteners having a head which bears against flange 134, a shaft that extends through apertures 248 and 244, and an end portion configured to releasably engage coupler 240. Such end portions may include inwardly and outwardly flexible hooks or claws and various other known releasable attachment mechanisms. In still other embodiments, coupler 242 may be permanently attached to flange 134 or may be integrally formed as part of a single unitary body with flange 134, wherein coupler 242 includes an end portion configured to extend through apertures 248 and 244 and into retaining engagement with coupler 240. In lieu of system 210 requiring aperture 248, coupler 242 may comprise a stud or boss projecting from flange 34 through aperture 244 into releasable but retaining engagement with coupler 240. In lieu of coupler 242 extending through aperture 244 and possibly aperture 248, coupler 240 may include a junction portion that extends through aperture 244 and through aperture 248 into releasable but retaining engagement with coupler 242. For example, in one embodiment, coupler 240 may include an internally threaded tubular portion that extends through apertures 244 and 248 while coupler 242 comprises a fastener having an externally threaded shaft that is threaded into the internal bore of coupler 240. Regardless of the particular configuration chosen, the resulting securement system 216 releasably secures chassis 132 to vertical support unit 112 without diminishing the size of opening 118. At the same time, system 216 includes a coupler 240 which is releasably secured to vertical support unit 112 independent of coupler 242, enabling coupler 240 to be secured to vertical support unit 112 while component 114 is removed from opening 118, facilitating easy securement of coupler 240 to vertical support unit 112.

Figure 5:
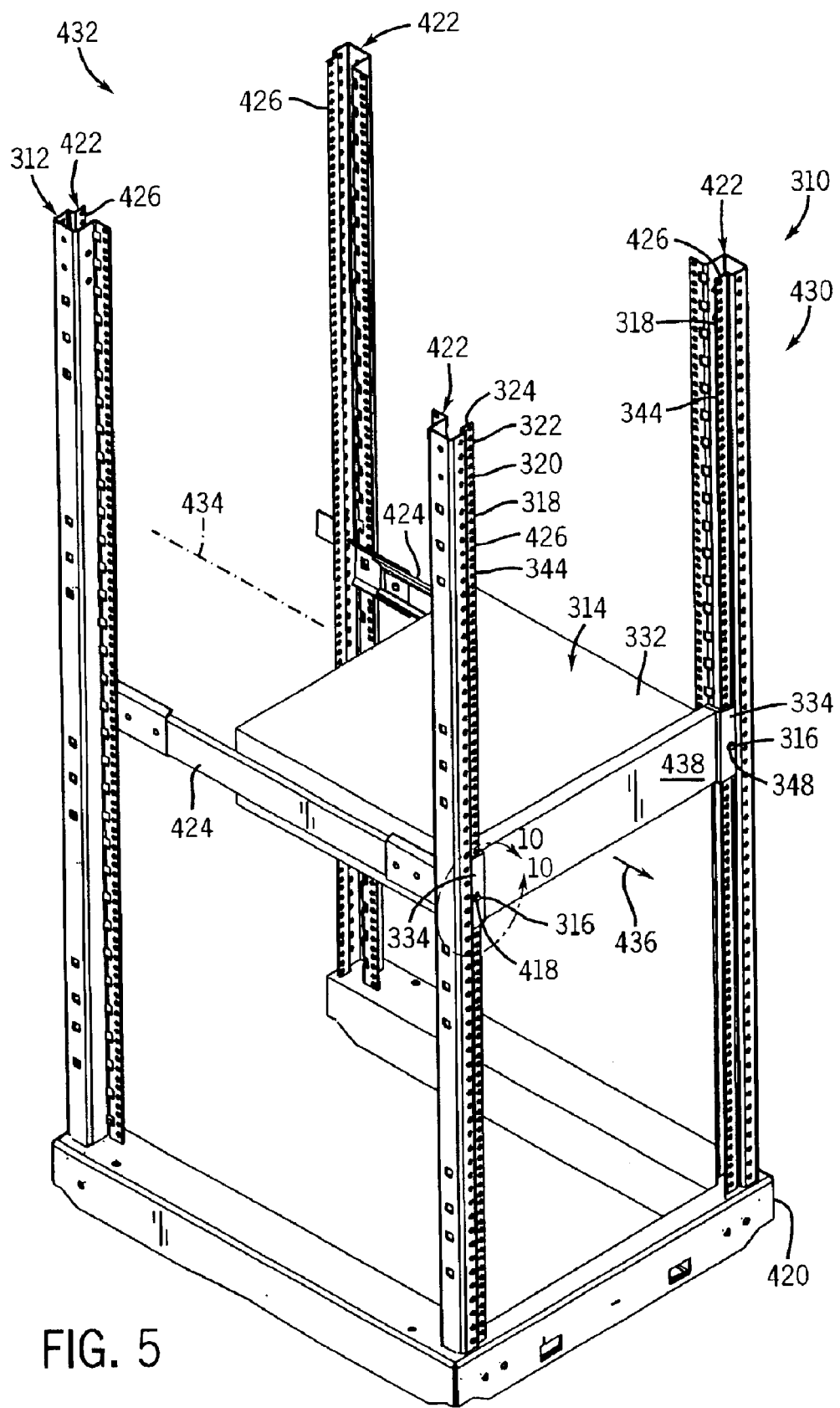
FIG. 5 is a perspective view of a second alternative embodiment of the electronic component support system of FIG. 3 including a component securement system securing an electronic component to a vertical support unit.

FIGS. 5–13 illustrate electronic component support system 310, a detailed alternative embodiment of system 110. As generally shown by FIG. 5, system 310 generally includes vertical support unit 312, electronic component 314 and component securement systems 316. Vertical support unit 312 comprises a standard EIA (Electronic Industries Association) 19-inch equipment rack. As shown by FIG. 5, vertical support unit 312 generally includes a base 420, posts or columns 422 and slides 424. Columns 422 extend upwardly from base 420 along the four corners of vertical support unit 312. Each of columns 422 is substantially identical to one another and includes an inwardly extending wall 426. Walls 426 at a first end 430 of vertical support unit 312 extend towards one another and terminate at border or opening facing edges or surfaces 320 which form or define an opening 318 through which component 314 is inserted between columns 422. Walls 426 at end 430 additionally include side surfaces 322, 324 which face in opposite directions generally parallel to the center line of opening 320 and generally parallel to the longitudinal axes of slides 424. Each of walls 426 additionally includes a plurality of support apertures 344 along the vertical length of each of walls 426. Support apertures 344 are generally spaced from one another in accordance with standard EIA 19-inch rack specifications.

Although columns 422 at end 432 of vertical support unit are illustrated as being substantially identical to column 422 at end 430, columns 422 at end 432 may have other configurations. Although vertical support unit 312 is illustrated as generally being open in nature, vertical support unit 312 may alternatively include one or more side panels secured to columns 422 to additionally enclose component 314. Furthermore, although securement system 316 is illustrated in FIGS. 5–15 in conjunction with a standard EIA 19-inch rack, securement system 316 may alternatively be employed with a vertical support unit 312 having an alternative configuration.

Slides 424 extend between columns 422 and facilitate the sliding movement of component 314 along axis 434. As a result, component 314 may be slid through opening 320 in the direction indicated by arrow 436 to facilitate service or replacement of component 314. Component 314 may be similarly inserted through opening 318 during installation. In the particular embodiment shown, end 430 of vertical support unit 312 is a front forward end configured to be situated adjacent to a front face 438 of component 314. In the particular applications, a bezel may also be secured to component 314 or to vertical support unit 312. An example of slide mechanism 424 is disclosed in U.S. Pat. No. 6,230,903 entitled "Snap-On Rack Slide Mounting System" and assigned to the assignee of the present application, the full disclosure of which is hereby incorporated by reference. Although vertical support unit 312 is illustrated as employing slides 424, vertical support unit 312 may alternatively be configured to vertically support component 314 in a stationary manner.

Component 314 is identical to component 114 described with respect to FIGS. 3 and 4. Component 314 includes a chassis 332 having outwardly extending flanges 334 which are fixedly coupled to the remainder of chassis 332 and which overlap sides 322 of walls 426. Each flange 334 includes at least one aperture 348 which facilitates securement of chassis 332 and component 314 to opposite walls 426 at end 430 of vertical support unit 312.

FIGS. 6–9 illustrate securement system 316 in greater detail. Securement system 316 generally includes coupler 340 and fastener 342 (shown in FIG. 10). As best shown by FIG. 6, coupler 340 is generally adapted to be releasably mounted to vertical support unit 312 so as to be supported by vertical support unit 312 prior to being coupled to chassis 332 of electronic component 314 and without reducing the size of opening 318. At the same time, coupler 340 is configured to be releasably coupled to chassis 332 to prevent movement of chassis 332 relative to vertical support unit 312 in at least one direction. In the particular embodiments illustrated, coupler 340 prevents movement of chassis 332 relative to vertical support unit 312 in three orthogonal directions.

As best shown by FIG. 6, coupler 340 generally includes body 350, tubular portions 352, 354 and prongs 356, 358. Body 350 generally comprises an elongate band of one or more materials so as to be sufficiently flexible to enable insertion of prongs 356 and 358 within corresponding apertures 344 and sufficiently rigid so as to sufficiently retain coupler 340 against wall 426 so as to retain prongs 356 and 358 within their corresponding support apertures 344 as fastener 342 is joined to coupler 340. In the particular embodiment illustrated, body 350 is formed from 304 stainless steel having a thickness of about 0.762 mm. Body 350 supports tubular portions 352, 354 and prongs 356, 358. Although body 350 is illustrated as generally a flat band, body 350 may alternatively have various other shapes and dimensions.

Tubular portions 352, 354 (also known as "volcanoes") extend from surface 359 of body 350 and provide coupler apertures 362, 364, respectively. In the embodiment illustrated, tubular portions 352 and 354 are formed by extruding material from body 350. In alternative embodiments, tubular portions 352 and 354 may be welded, fastened, bonded or otherwise fixedly coupled to body 350. Although tubular portions 352 and 354 are illustrated as generally being cylindrical in shape, tubular portions 352 and 354 may have various other external configurations. Although tubular portions 352 and 354 are illustrated as completely surrounding apertures 362 and 364, respectively, tubular portions 352 and 354 may only partially surround apertures 362 and 364, respectively. Although tubular portions 352 and 354 are illustrated as being fixedly coupled to body 350, tubular portions 352 and 354 may alternatively be releasably supported relative to body 350. For example, tubular portions 352 and 354 may alternatively comprise tubular members or nuts which are releasably fastened to body 350 or which are releasably held within correspondingly shaped recesses or cavities or by means of friction or detent and detent engaging protuberance structures which secure such tubular portions 352 and 354 to body 350.

Coupler apertures 362 and 364 generally comprise bores or internal openings passing through tubular portions 352 and 354 and through body 350. Coupler apertures 362 and 364 are generally configured to be releasably coupled to fastener 342. In the particular embodiment illustrated, coupler apertures 362 and 364 are internally threaded so as to threadably engage externally threaded shaft to fastener 342. In alternative embodiments, coupler apertures 362 and 364 may have other configurations depending upon the configuration of fastener 342 for releasably engaging fastener 342.

Although coupler apertures 362 and 364 are illustrated as being provided by tubular portions 352 and 354 which project from surface 360, apertures 362 and 364 may alternatively be formed by body 350, alone, depending upon the mechanism employed within apertures 362 and 364 to engage fastener 342 and depending upon the thickness of body 350. In the embodiment shown, coupling apertures 362 and 364 have a minimum of three threads for engagement with fastener 342.

Prongs 356 and 358 generally comprise members configured to project through support apertures 344 and to engage or abut side surface 324 of wall 426. In the particular embodiment shown, prongs 356 and 358 comprise generally L-shaped members which project away from one another at opposite ends of body 350. Each prong 356, 358 generally includes a leg portion 360 and a foot portion 362. In the particular embodiment illustrated, leg portion 360 has a height H, of approximately 2.7 mm., foot portion 362 has a length L, of approximately 6.07 mm., and portions 360 and 362 each have a width W, of approximately 4.25 mm. Although such dimensions are specifically chosen for facilitating insertion of prongs 358 through support apertures 344, prongs 356 and 358 may have various other dimensions as well as shapes, depending upon the type of support, the size and dimensions of the support apertures into which or through prongs 356 and 358 must be inserted.

Because coupler 340 is integrally formed as part of a single unitary body, coupler 340 is easily manufactured at low cost. Although less desirable, coupler 340 may alternatively be composed of several individual portions or members which are fastened or otherwise coupled to one another.

Figure 8:
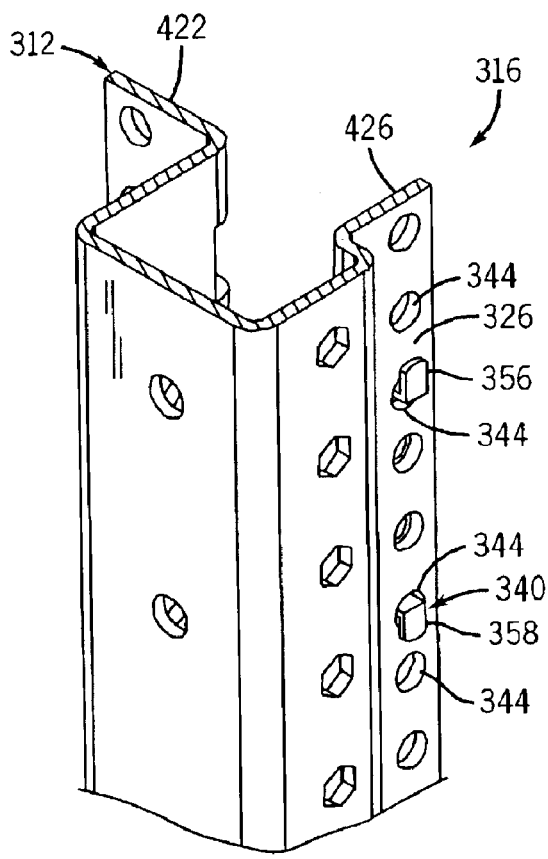
FIG. 8 is a fragmentary front perspective view of the vertical support unit of FIG. 7 with the coupler mounted thereto.
Figure 9:
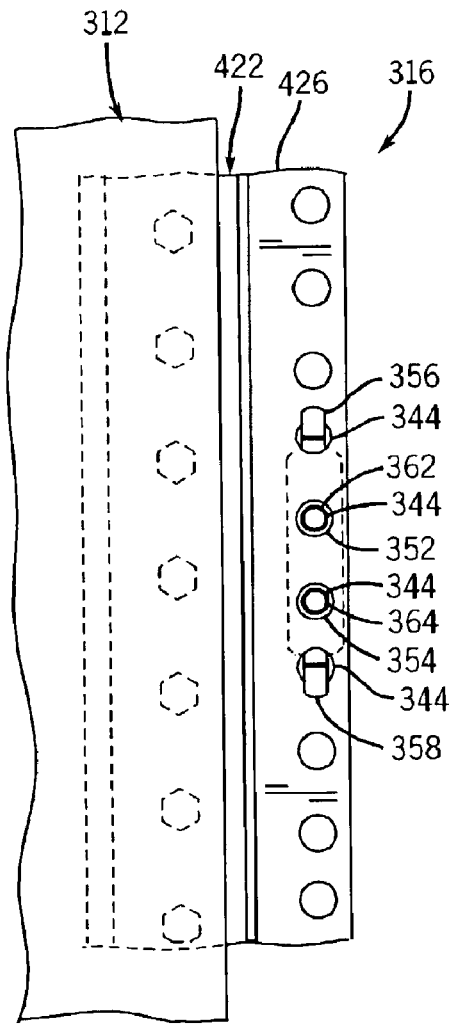
FIG. 9 is a fragmentary front elevational view of the vertical support unit of FIG. 5 with the coupler mounted thereto.

FIGS. 7–9 illustrate coupler 340 being mounted to wall 426 of one of columns 422. As best shown by FIG. 7, coupler 340 is mounted to wall 426 along side surface 324 such that body 350 generally lies against side surface 324. As shown by FIG. 8, prongs 356 and 358 are inserted through corresponding support apertures 344 until prongs 353, 356 and 358 abut or engage against side surface 426 of wall 426. Such insertion may be performed in one of two ways. First, one of prongs 356, 358 may be inserted into its corresponding aperture 344 and moved to a sufficient extent such that the other prongs 356 and 358 may be inserted into its respective aperture. Second, body 350 may be partially flexed to further facilitate either simultaneous or sequential insertion of prongs 356 and 358 into their respective support apertures 344. Because prongs 356 and 358 have a minimum thickness, prongs 356 and 358 minimally project above side surface 326, enabling flange 334 to be positioned in relative close proximity to side surface 326 of wall 426. The height H of prongs 356 and 358 are generally sufficient to enable prongs 356 and 358 to extend completely through support aperture 344 yet small enough such that body 350 and the tip of prongs 356 and 358 bear against wall 426 with minimal movement to better facilitate alignment of coupler aperture 362 or 364 with a desired support aperture 344.

Figure 10:
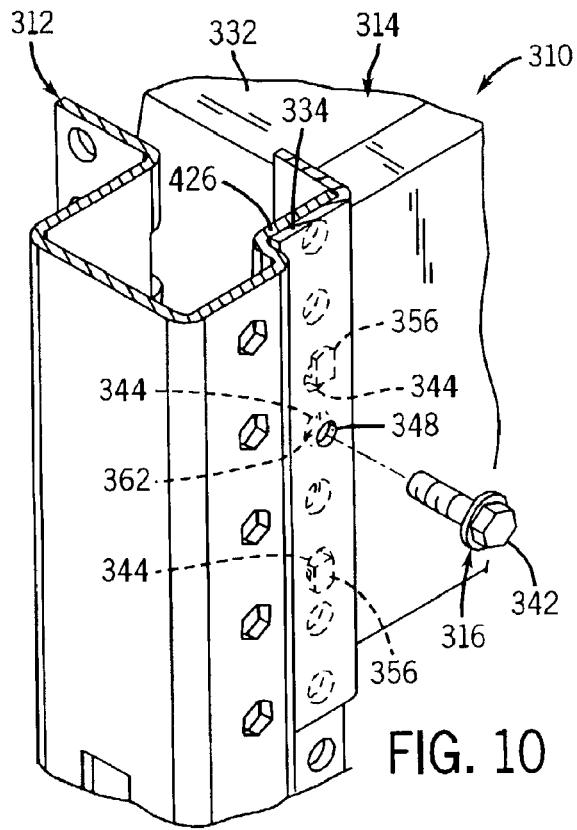
FIG. 10 is an enlarged fragmentary perspective view of the component support system of FIG. 5 prior to insertion of a fastener through the component, through the vertical support unit and into engagement with the coupler.
Figure 11:
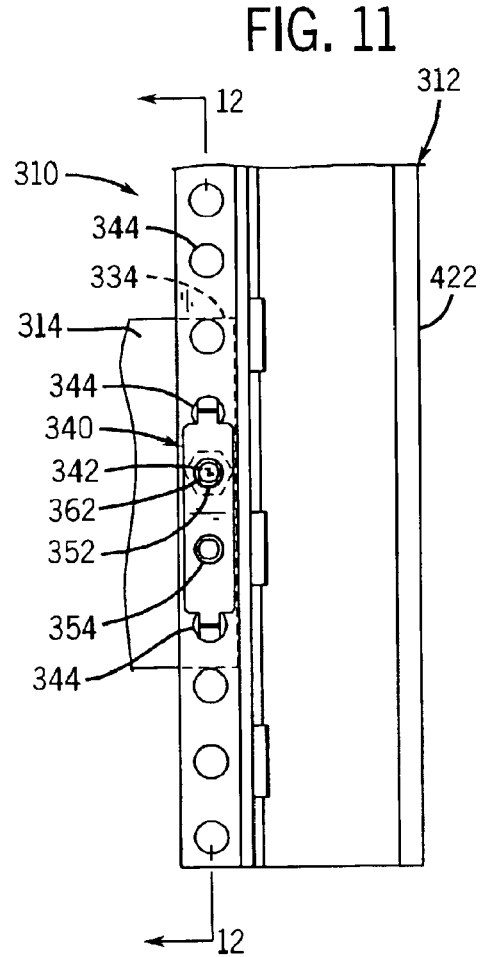
FIG. 11 is a rear elevational view of the component support system of FIG. 5 illustrating the securement system securing the electronic component to the vertical support unit.

FIGS. 10–12 illustrate the securement of component 314 and its chassis 332 to vertical support unit 312 by securement system 316. As shown by FIG. 3, once prongs 356 and 358 have been inserted into and through their respective support apertures 344, component 314 is positioned within opening 318 such that flanges 334 overlap walls 426 on opposite sides of vertical support unit 312. For ease of illustration, only one side of vertical support unit 312 is shown in FIGS. 10–12. Chassis aperture 348 is aligned with support aperture 344 which is in alignment with coupler aperture 362. Fastener 342 is inserted through chassis aperture 348 through support aperture 344 and into coupler aperture 362 where fastener 342 and coupler aperture 362 engage one another to retain chassis 332 and vertical support unit 312 relative to one another in three orthogonal directions. To remove component 314, fastener 342 is simply withdrawn, enabling flange 334 to be pulled away from wall 426. Although flange 334 is illustrated as including a single chassis aperture 348 and although securement system 316 is illustrated as employing a single fastener 342, flange 334 may alternatively include a plurality of apertures 348 while securement system 316 may include a plurality of fasteners 342 and a plurality of apertures 348, which pass through a plurality of support apertures 344 and which extend into a plurality of coupler apertures provided by coupler 340.

As best shown by FIGS. 12 and 13, coupler apertures 362 and 364 are non-uniformly spaced relative to one another and relative to legs 360 of prongs 356 and 358. Because coupler apertures 362 and 364 are offset relative to the ends of coupler 340, coupler apertures 362 and 364 may be aligned with any one of support apertures 344 which are non-uniformly spaced from one another or staggered along wall 426 per EIA standards. FIG. 12 illustrates coupler 340 mounted to wall 426 in which both of coupler apertures 362 and 364 are aligned with corresponding support apertures 344. FIG. 13 illustrates coupler 340 mounted to wall 426 at different positions in which only one of coupler apertures 362, 364 is aligned with a corresponding support aperture 344. In the particular embodiment illustrated, the center lines of coupler apertures 362 and 364 are spaced from one another with a spacing S of approximately 15.87 mm. Coupler aperture 362 is spaced from leg 360 of prong 356 by a spacing, S1, of approximately 15.50 mm. The center line of coupler aperture 364 is spaced from leg 360 of prong 358 by a spacing, S3, of approximately 12.33 mm. In alternative embodiments, spacings S1, S2 and S3 may be varied depending upon the spacings of support apertures 344 in vertical support unit 312.

In alternative embodiments, coupler 340 may be provided with greater than two coupler apertures depending upon the arrangement of support apertures 344, as well as the desired number of fasteners 342 that are to be used to secure component 314 to vertical support unit 312. In particular applications, component 340 may include two or a greater number of coupler apertures and may have a sufficient length so as to facilitate procurement of a plurality of components 314 to vertical support unit 312. Although less desirable, coupler 340 may alternatively be provided with a single coupler aperture wherein spacing of support apertures 344 are uniform or wherein some of support apertures 344 are not to be used for securement of component 314 to vertical support unit 312.

FIG. 14 illustrates coupler 540, an alternative embodiment of coupler 340. Coupler 540 generally includes body 550, tubular portions 552, 554 and prongs 556, 558. Body 550 is substantially identical to body 350 and supports tubular portions 552, 554 and prongs 556, 558. Tubular portions 552 and 554 are substantially identical to tubular portions 352 and 354 except that tubular portions 552 and 554 are coupled to body 550 on one end of body 550 and one side of prongs 556, 558, rather than being disposed between the prongs as with coupler 340. Prongs 556 and 558 are similar to prongs 356 and 358 except that prongs 556 and 558 extend from a rear face 562 of body 550 and except that prongs 556 and 558 extend towards one another rather than away from one another. Prongs 556 and 558 are spaced from one another and are sized so as to be insertable through corresponding support apertures 344 to support body 550 against side surface 324 of wall 426 with at least one of the coupler apertures of portions 552, 554 in alignment with an adjacent support aperture 344. In one embodiment, prongs 556 and 558 are arranged relative to one another so as to be situated within corresponding support apertures 344 without flexing any portion of coupler 540. In another embodiment, body 550 flexes to facilitate insertion of prongs 556 and 558 through support apertures 344. In yet another embodiment, prongs 556 and 558 are sufficiently flexible to facilitate their insertion through corresponding support apertures 344.

FIG. 15 illustrates coupler 640, a second alternative embodiment of coupler 340. Coupler 640 is substantially identical to coupler 540 except that coupler 640 includes mounting portion 666 in lieu of prongs 556 and 558 which serve as mounting portions for coupler 540. Mounting portion 666 extends from rear face 562 of body 550 and is configured to be releasably or removably inserted through a single support aperture 344 and so as to engage wall 426 to retain body 550 against side surface 324 of wall 426 with at least one of the coupler apertures of portions 552 and 554 in alignment with an adjacent support aperture 344. In the embodiment shown, mounting portion 666 is generally mushroom-shaped and includes a stem 668 and a resiliently flexible head 670. To mount coupler 640 to wall 426 of rear support unit 312, head 670 is inserted through a support aperture 344 which results in head 670 resiliently flexing inwardly and then returning to its initial shape after passing through the support aperture 344. Head 670 bears against side surface 326 at a plurality of locations about aperture 344 to retain coupler 640 in place. The stem 68 is preferably dimensioned so as to provide frictional engagement between head 670 and side surface 326. In one embodiment, stem 68 may also be dimensioned so as to engage the internal sides of aperture 344. Although head 670 is illustrated as a continuous cone-shaped portion, head 670 may alternatively include a plurality of adjacent or spaced segments which resiliently flex relative to one another during insertion of head 670 through aperture 344.

Overall, the electronic component securement systems 116, 216 and 316 and couplers 240, 242, 340, 540 and 640 securely retain a chassis of an electronic component relative to a vertical support unit without encroaching upon or reducing the size of the opening of the vertical support unit into which the component chassis is inserted. As a result, the sides or horizontal width of the chassis may be enlarged to provide a multitude of beneficial features such as increased thermal margin (increased space between components), larger, more robust structures or electronic hardware to improve structural integrity, or additional, larger capacity electrical hardware. The resulting larger effective size of the opening also facilitates easier insertion and removal of the component without damage or scratching of the component chassis.

At the same time, because couplers of the component securement system are movable along the vertical support unit or are configured to be mounted to the vertical support unit at a plurality of vertical locations, the securement system may be used to retain the electronic component at any one of a variety of vertical locations relative to the vertical support unit. This result is achieved without requiring a vertical support unit having a multitude of tapped or threaded apertures. In addition, because the couplers of the securement systems are configured to be independently supported by the vertical support unit prior to being coupled to the electronic component, the couplers may be secured to the vertical support unit prior to insertion of the component into the opening. As a result, easier mounting of the coupler to the vertical support unit is facilitated.

Although the present invention has been described with reference to preferred embodiments, workers skilled in the art will recognize that changes may be made in form and detail without departing from the spirit and scope of the invention. For example, although different preferred embodiments may have been described as including one or more features providing one or more benefits, it is contemplated that the described features may be interchanged with one another or alternatively be combined with one another in the described preferred embodiments or in other alternative embodiments. Because the technology of the present invention is relatively complex, not all changes in the technology are foreseeable. The present invention described with reference to the preferred embodiments and set forth in the following claims is manifestly intended to be as broad as possible. For example, unless specifically otherwise noted, the claims reciting a single particular element also encompass a plurality of such particular elements.

What is claimed is:

1. An electronic component securement system for use with a vertical support unit having a support aperture and an electronic component chassis positioned within an opening of the vertical support unit, the system comprising:

a coupler having a first coupler aperture and adapted to be releasably mounted to the vertical support unit so as to be supported by the vertical support unit prior to being coupled to the electronic component and without diminishing a size of the opening and such that the first coupler aperture at least partially overlies the support aperture without the support aperture being occupied, wherein the coupler is configured to be releasably coupled to the chassis to prevent movement of the chassis relative to the vertical support unit in at least one direction.

2. The system of claim 1, wherein the vertical support unit includes a first surface facing the opening and a second surface extending non-parallel to the first surface, wherein the coupler is configured to be releasably mounted to the second surface without extending across the first surface.

3. The system of claim 2, wherein the second surface includes the support aperture.

4. The system of claim 3 including a projection configured to extend from the chassis, through the support aperture and into the coupler aperture.

5. The system of claim 4, wherein the projection is configured to engage the coupler within the coupler aperture to retain the coupler relative to the chassis.

6. The system of claim 5, wherein the coupler aperture is internally threaded, wherein the projection is externally threaded and wherein the projection is in threaded engagement with the coupler aperture.

7. The system of claim 6 including a fastener releasably coupled to the chassis and providing the projection.

8. The system of claim 2, wherein the second surface includes the support aperture and wherein the securement system includes a projection coupled to the component chassis and configured to extend into the first coupler aperture.

9. The system of claim 8, wherein the projection attaches to the coupler within the first coupler aperture.

10. The system of claim 9, wherein the first coupler aperture includes internal threads, wherein the projection includes external threads and wherein the projection is threaded into the first coupler aperture.

11. The system of claim 9 including a fastener releasably coupled to the chassis and including the projection.

12. The system of claim 8, wherein the coupler includes a second coupler aperture.

13. The system of claim 12, wherein the coupler has a first end and a second opposite end, wherein the first coupler aperture is spaced from the first end by a first distance and wherein the second coupler aperture is spaced from the second end by a second distance different than the first distance.

14. The system of claim 12, wherein the second coupler aperture is internally threaded.

15. The system of claim 1, wherein the vertical support unit includes a first support aperture and a second support aperture and wherein the coupler includes a first mounting portion adapted to be positioned within the first support aperture and a second mounting portion adapted to be positioned within the second support aperture.

16. The system of claim 15, wherein the vertical support unit includes a third support aperture, wherein the coupler includes a coupler aperture configured to at least partially overlie the third support aperture when the first mounting portion and the second mounting portion are positioned within the first support aperture and the second support aperture, respectively.

17. The system of claim 16, wherein the third support aperture is between the first support aperture and the second support aperture and wherein the first mounting portion and the second mounting portion are configured to be located on opposite sides of the third support aperture when positioned within the first support aperture and the second support aperture, respectively.

18. The system of claim 17, wherein the first mounting portion and the second mounting portion are configured to be located above and below the third support aperture when positioned within the first support aperture and the second support aperture, respectively.

19. The system of claim 15, wherein the first mounting portion comprises a first prong and wherein the second mounting portion comprises a second prong and wherein the first and second prongs extend in opposite directions.

20. The system of claim 1, wherein the coupler includes:

a band;

a first prong extending from the band;

a second prong extending from the band;

a tubular portion extending from the band; and a coupler aperture extending through the tubular portion and the band, wherein the first prong and the second prong are configured to engage the vertical support unit and wherein the coupler aperture facilitates coupling of the coupler to the component chassis.

21. The system of claim 20, wherein the coupler is integrally formed as a single unitary body.

22. The system of claim 20, wherein the vertical support unit includes a plurality of vertically spaced support apertures and wherein the first prong and the second prong are configured to be simultaneously inserted into a first support aperture and a second support aperture of the plurality of support apertures.

23. An electronic component support system comprising:

a vertical support unit having an opening and including a plurality of vertically spaced support apertures;

an electronic component having a chassis positioned within the opening; and a securement system including:

a coupler configured to be releasably coupled to and supported by the vertical support unit prior to be coupled to the chassis and without projecting into the opening, wherein the coupler is coupled to the chassis to secure the chassis against movement in at least one direction relative to the vertical support unit and wherein the coupler includes a first mounting portion projecting through a first one of the plurality of support apertures and a second mounting portion extending through a second one of the plurality of support aperture.

24. The system of claim 23, wherein the coupler is configured to secure the chassis against movement in two orthogonal directions.

25. The system of claim 23, wherein the coupler is configured to secure the chassis against movement in three orthogonal directions.

26. The system of claim 23, wherein the securement system includes a projection extending from the chassis into engagement with the coupler.

27. The system of claim 26, wherein the projection is threaded into the coupler.

28. The system of claim 23, wherein the coupler is integrally formed as a single unitary body.

29. The system of claim 23, wherein the vertical support unit includes a vertical column wall having a first surface, a second opposite surface and a third edge surface facing the electronic component and bordering the opening, wherein the coupler is configured to be releasably coupled to the wall without extending over the third edge surface.

30. The system of claim 29, wherein the first one of the support apertures extends through the wall from the first surface to the second surface and wherein the first mounting portion extends through the first one of the support apertures when coupled to the wall.

31. The system of claim 30, wherein the electronic component has a forward facing front, wherein the first surface faces forward and wherein a majority of the coupler extends along the second surface.

32. The system of claim 31, wherein the coupler includes at least one coupler aperture in substantial alignment with at least one of the plurality of support apertures.

33. The system of claim 32, wherein the at least one coupler aperture is internally threaded.

34. The system of claim 33 including an externally threaded fastener releasably coupled to the chassis and threaded into the at least one coupler aperture.

35. The system of claim 23, wherein the chassis includes a main housing and a flange extending outwardly from the housing so as to overlap a front surface of the vertical support unit and wherein the securement system includes a projection extending from the flange into engagement with the coupler.

36. A coupler for use as part of a securement system for securing an electronic component within an opening of a vertical support unit having an opening border surface facing the opening, the coupler comprising:

a body configured to be releasably coupled to the vertical support unit and independently supported by the vertical support unit without extending across the opening border surface, wherein the coupler assists in securing the chassis of the electronic component to the vertical support unit, wherein the vertical support unit includes a plurality of vertically spaced support apertures and wherein the body includes a plurality of mounting portions configured to at least partially project into the plurality of support apertures when attached to the vertical support unit.

37. The coupler of claim 36, wherein the body includes at least one coupler aperture configured to overlie at least one of the plurality of support apertures when the coupler is attached to the vertical support unit.

38. The coupler of claim 37, wherein the at least one coupler aperture is internally threaded.

39. The coupler of claim 38, wherein the coupler is integrally formed as a single unitary body.

40. The coupler of claim 38, wherein the at least one coupler aperture includes a first coupler aperture and a second coupler aperture, wherein the coupler has a first end and a second opposite end, wherein the first coupler aperture is spaced from the first end by a first distance and wherein the second coupler aperture is spaced from the second end by a second distance different than the first distance.

41. A method for securing an electronic component chassis to a vertical support unit having a first support aperture while the chassis is within an opening of the vertical support unit, the method comprising:

releasably coupling a coupler having a coupler aperture to the vertical support unit such that the coupler is independently supported by the vertical support unit without intruding into the opening and such that the coupler aperture at least partially overlies the support aperture without the first support aperture being occupied; and securing the electronic component chassis to the coupler.

42. The method of claim 41, wherein the vertical support unit includes a plurality of vertically spaced support apertures other than the first support aperture and wherein the step of releasably coupling the coupler to the vertical support unit includes inserting at least one portion of the coupler through at least one of the plurality of support apertures.

43. The method of claim 42, wherein the plurality of support apertures extend from a first side to a second opposite side and wherein the step of coupling the coupler to the vertical support unit includes positioning a main portion of the coupler adjacent the first side, inserting a mounting portion of the coupler through one of the support apertures and positioning the mounting portion adjacent the second side.

44. The method of claim 41, wherein the step of securing the chassis to the coupler includes inserting a projection coupled to the chassis into the coupler.

45. The method of claim 44 including inserting a fastener providing the projection through the chassis and rotating the fastener to thread the projection into the coupler.

46. The method of claim 43, wherein the step of securing the chassis to the coupler includes inserting a projection extending from the chassis through one of the plurality of support apertures and at least partially into the coupler.

47. The method of claim 41, wherein the vertical support unit includes a second support aperture and a third support aperture and wherein the step of releasably coupling the coupler to the vertical support unit includes inserting a first mounting portion of the coupler into the second support aperture and inserting a second mounting portion of the coupler into the third support aperture.

48. An electronic component securement system for use with a vertical support unit and an electronic component chassis positioned within an opening of the vertical support unit, the system comprising:

a coupler adapted to be releasably mounted to the vertical support unit so as to be supported by the vertical support unit prior to being coupled to the electronic component and without diminishing a size of the opening, wherein the coupler is configured to be releasably coupled to the chassis to prevent movement of the chassis relative to the vertical support unit in at least one direction, wherein the coupler includes a first coupler aperture extending along a first axis and a second coupler aperture extending along a second axis.

49. The system of claim 48, wherein the coupler has a first end and a second opposite end, wherein the first coupler aperture is spaced from the first end by a first distance and wherein the second coupler aperture is spaced from the second end by a second distance different than the first distance.

50. An electronic component securement system for use with a vertical support unit and an electronic component chassis positioned within an opening of the vertical support unit, the system comprising:

a coupler adapted to be releasably mounted to the vertical support unit so as to be supported by the vertical support unit prior to being coupled to the electronic component and without diminishing a size of the opening, wherein the coupler is configured to be releasably coupled to the chassis to prevent movement of the chassis relative to the vertical support unit in at least one direction, wherein the vertical support unit includes a first support aperture and a second support aperture and wherein the coupler includes a first mounting portion adapted to be positioned within the first support aperture and a second mounting portion adapted to be positioned within the second support aperture.

51. An electronic component securement system for use with a vertical support unit and an electronic component chassis positioned within an opening of the vertical support unit, the system comprising:

a coupler adapted to be releasably mounted to the vertical support unit so as to be supported by the vertical support unit prior to being coupled to the electronic component and without diminishing a size of the opening, wherein the coupler is configured to be releasably coupled to the chassis to prevent movement of the chassis relative to the vertical support unit in at least one direction, wherein the coupler includes:

a band;
a first prong extending from the band;
a second prong extending from the band;
a tubular portion extending from the band; and
a coupler aperture extending through the tubular portion and the band, wherein the first prong and the second prong are configured to engage the vertical support unit and wherein the coupler aperture facilitates coupling of the coupler to the component chassis.

* * * * *